(12) United States Patent
Shibata

(10) Patent No.: US 7,435,608 B2
(45) Date of Patent: Oct. 14, 2008

(54) III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

(75) Inventor: Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/589,771

(22) Filed: Oct. 31, 2006

(65) Prior Publication Data
US 2007/0040219 A1     Feb. 22, 2007

Related U.S. Application Data

(62) Division of application No. 10/928,739, filed on Aug. 30, 2004, now abandoned.

(30) Foreign Application Priority Data
May 31, 2004    (JP)    ............................. 2004-162189

(51) Int. Cl.
*H01L 21/00*    (2006.01)
(52) U.S. Cl. ........................... 438/46; 438/47; 438/481; 438/977; 257/E29.003

(58) Field of Classification Search ............ 257/79–103; 438/36, 46, 47, 481, 977
See application file for complete search history.

(56) References Cited

U.S. PATENT DOCUMENTS

| 5,814,533 | A   | * | 9/1998  | Shakuda ....................... 438/46 |
| 2002/0197825 | A1 | * | 12/2002 | Usui et al. .................. 438/459 |
| 2003/0205717 | A1 | * | 11/2003 | Khare et al. ................. 257/103 |
| 2005/0093003 | A1 | * | 5/2005  | Shibata ........................ 257/79 |
| 2005/0208687 | A1 |   | 9/2005  | Kasai et al. |

FOREIGN PATENT DOCUMENTS

| JP | 11-251253   | 9/1999  |
| JP | 2000-223743 | 8/2000  |
| JP | 2003-165799 | 6/2003  |
| JP | 2003-178984 | 6/2003  |
| JP | 2005-298319 | 10/2005 |

OTHER PUBLICATIONS

Nam, et al., "Lateral epitaxy of low defect density GaN layers via organometallic vapor phase epitaxy", Appl. Phys. Lett. 71. Nov. 3, 1997, pp. 2638-2640.

(Continued)

*Primary Examiner*—Wai-Sing Louie
(74) *Attorney, Agent, or Firm*—McGinn IP Law Group, PLLC

(57) ABSTRACT

A III-V group nitride system semiconductor self-standing substrate is made of III-V group nitride system semiconductor single crystal with a hexagonal crystal system crystalline structure. The substrate is provided with a surface that is off-oriented 0.09 degrees or more and 24 degrees or less in the a-axis or m-axis direction from C-face of the substrate.

15 Claims, 5 Drawing Sheets

OTHER PUBLICATIONS

Masaru Kuramoto, et al., "Room-Temperature Continuous-Wave Operation of InGaN Multi-Quantum-Well Laser Diodes Grown on an n-GaN Substrate with a Backside n-Contact", Japanese Applied Physics. vol. 38, Part 2, No. 2B, Feb. 15, 1999, pp. L184-186.

Tsvetanka S. Zheleva, et al., "Pendeo-Epitaxy-A New Approach for Lateral Growth of Gallium Nitride Structures". Cite this article as: MRS Internet J. Nitride Semicond. Res. 4SI. G3.38 (1999).

Yuichi Oshima, et al., "Preparation of Freestanding GaN Wafers by Hydride Vapor Phase Epitaxy with Void-Assisted Separation". Japanese Journal Applied Physics. vol. 42, Part 2, No. 1A/B. Jan. 15, 2003, pp. L1-L3.

Kensaku Motoki, et al., "Preparation of Large Freestanding GaN Substrates by Hydride Vapor Phase Epitaxy Using GaAs as a Starting Substrate", Japanese Journal Applied Physics. vol. 40, Part 2, No. 2B, Feb. 15, 2001, pp. L140-L143.

* cited by examiner

21 SAPPHIRE SUBSTRATE

22 UNDOPED GaN LAYER
21

23 Ti THIN FILM
22
21

25 SLOTTED TiN LAYER
24 VOID-FORMED GaN LAYER
21

26 GaN LAYER
25
24
21

26
25
24
21

30 GaN SELF-STANDING SUBSTRATE

III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

The present Application is a Divisional Application of U.S. patent application Ser. No. 10/928,739, filed on Aug. 30, 2004 now abandoned.

The present application is based on Japanese patent application No. 2004-162189, the entire contents of which are incorporated herein by reference.

BACKGROUND OF THE INVENTION

1. Field of the Invention

The present invention relates to a III-V group nitride system semiconductor self-standing substrate, a method of making the same, a III-V group nitride system semiconductor wafer.

2. Description of the Related Art

Nitride system semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be used for short-wavelength light emitting devices. Further, they have a high saturation drift velocity of electron and can use two-dimensional carrier gases in hetero junction. Therefore, they are also expected to be used for electronic devices.

With silicon (Si) or gallium arsenide (GaAs) which is already in popular use, an epitaxial growth layer of silicon (Si) or gallium arsenide (GaAs) to compose a device is homo-epitaxially grown on Si substrate or GaAs substrate of same kind of material. In the homo-epitaxial growth on homo-substrate, the crystal growth proceeds in step flow mode on the initial stage. Therefore, it is easy to obtain a flat and epitaxially grown surface while generating little crystal defect.

In the case that a ternary or more compound crystal layer such as AlGaInP is grown on GaAs substrate, the surface morphology of epitaxial layer is likely to be roughened. However, by intentionally inclining the plane orientation of underlying substrate from a low index surface as a reference surface to a specific direction, which is generally called "off-orientation", it becomes possible to obtain a flat epitaxially grown surface while generating little crystal defect. The direction or angle of off-orientation can have an optimum value according to the kind of material or growth conditions of an epi-layer grown thereon, and an optimum off-direction or off-angle common to all material substrates does not exist. For example, in case of GaAs substrate, it is inclined from its (001)-face as a reference surface to [110] direction or [1-10] direction, and its off-angle varies in the range of about 0 to 20 degrees.

On the other hand, it is difficult to grow a bulk crystal of nitride system semiconductor, and a GaN self-standing substrate did not exist before the epitaxial growth of nitride is researched. Therefore, nitride system semiconductor crystal has been hetero-epitaxially grown on underlying single-crystal sapphire as a hetero-substrate by using a vapor-phase growth process such as MOVPE (metal organic vapor phase epitaxy), MBE (molecular beam epitaxy) and HVPE (hydride vapor phase epitaxy). Even now, such a process is used for the manufacture of blue LED's.

However, in the hetero-epitaxial growth on hetero-substrate, a number of dislocations (defects) must be generated in grown crystal due to a lattice mismatch between the underlying substrate and the grown crystal. Therefore, if such process is applied to a device such as a laser diode sensitive to the crystal defect, the light output lowers and the lifetime of device is shortened.

In recent years, ELO (epitaxial lateral overgrowth; e.g., Appl. Phys. Lett. 71 (18) 2638 (1997)), FIELO (facet-initiated epitaxial lateral overgrowth; e.g., Jpan. J. Appl. Phys. 38, L184 (1999)) and pendeoepitaxy (e.g., MRS Internet J. Nitride Semicond. Res. 4S1, G3.38 (1999)) are reported as a growth method for reducing a defect density generated due to the lattice mismatch between sapphire and GaN. In these methods, a $SiO_2$ patterning mask etc. is formed on GaN grown on a sapphire substrate, and then GaN is selectively grown from the mask window. Thereby, the propagation of dislocation from underlying crystal can be suppressed. Due to such a growth method, the dislocation density in GaN can be significantly reduced to a level of $10^7$ cm$^{-2}$ or so.

Further, various methods of making a self-standing GaN substrate are suggested that a thick GaN layer with reduced dislocation density is epitaxially grown on a hetero-substrate such as sapphire and then the GaN layer grown is separated from the underlying substrate. For example, Japanese patent application laid-open No. 11-251253 discloses a method of making a self-standing GaN substrate that a GaN layer is grown on a sapphire substrate by ELO and then the sapphire substrate is removed by etching.

Other than this, VAS (Void-Assisted Separation: e.g., Y. Oshima et al., Jpn. J. Appl. Phys. Vol. 42 (2003) pp. L1-L3, Japanese patent application laid-open No. 2003-178984) and DEEP (Dislocation Elimination by the Epi-growth with inverted-Pyramidal pits: e.g., K. Motoki et al., Jpn. J. Appl. Phys. Vol. 40 (2001) pp. L140-L143, Japanese patent application laid-open No. 2003-165799) are known. The VAS is conducted such that GaN is grown through TiN thin film with a mesh structure on substrate such as sapphire while providing voids at the interface of underlying substrate and GaN layer, thereby allowing both the separation and the dislocation reduction of GaN substrate. The DEEP is conducted such that GaN is grown on a GaAs substrate, which is removable by etching, by using a SiN patterning mask while intentionally forming pits surrounded by facets on the surface of crystal, accumulating dislocations at the bottom of pits to allow regions other than pits to have a low dislocation density.

However, even when such a GaN self-standing substrate is used to grow a GaN system epitaxial layer thereon, it is difficult to flatten its surface morphology in the epitaxial growth while offering high flatness, uniformity and reproducibility.

To use an off-oriented GaN self-standing substrate may be thought in flattening the surface morphology of epi-layer of nitride system semiconductor grown thereon, as in the case of the other compound semiconductor substrate such as GaAs substrate. However, it is unknown what off-direction and how much off-angle of GaN self-standing substrate is proper in growing epitaxially a nitride system semiconductor layer. Further, even when a proper off-angle is found, the GaN self-standing substrate with the proper off-angle cannot be made with a good reproducibility since it is still made by separating a thick crystal grown hetero-epitaxially from the hetero-substrate, different from the case of a GaAs substrate that a wafer can be cut off from an ingot grown as a bulk crystal.

SUMMARY OF THE INVENTION

It is an object of the invention to provide a III-V group nitride system semiconductor self-standing substrate that has a predetermined off-angle suitable for the epitaxial growth of III-V group nitride system semiconductor layer.

It is a further object of the invention to provide a method of making the III-V group nitride system semiconductor self-standing substrate that has a predetermined off-angle with a good reproducibility.

It is a further object of the invention to provide a III-V group nitride system semiconductor wafer that a III-V group nitride system semiconductor layer is homo-epitaxially grown on the self-standing substrate with good flatness, uniformity and reproducibility.

According to first aspect of the invention, a III-V group nitride system semiconductor self-standing substrate comprises:

III-V group nitride system semiconductor single crystal with a hexagonal crystal system crystalline structure, wherein the substrate is provided with a surface that is off-oriented 0.09 degrees or more and 24 degrees or less in the a-axis direction from C-face of the substrate.

According to second aspect of the invention, a III-V group nitride system semiconductor self-standing substrate comprises:

III-V group nitride system semiconductor single crystal with a hexagonal crystal system crystalline structure, wherein the substrate is provided with a surface that is off-oriented 0.09 degrees or more and 24 degrees or less in the m-axis direction from C-face of the substrate.

It is more desirable that the surface is off-oriented 0.2 degrees or more and 20 degrees or less in the a-axis or m-axis direction from C-face of the substrate.

It is desirable that the off-orientation has an in-plane dispersion of within ±1 degree and the minimum off-orientation is 0.09 degrees or more and the maximum off-orientation is 24 degrees or less. It is more desirable that the off-orientation has an in-plane dispersion of within ±0.5 degrees and the minimum off-orientation is 0.2 degrees or more and the maximum off-orientation is 20 degrees or less.

The III-V group nitride system semiconductor can be represented by $In_xGa_yAl_{1-x-y}N$ ($0 \leq x \leq 1$, $0 \leq y \leq 1$, $0 \leq x+y \leq 1$).

According to third aspect of the invention, a method of making a III-V group nitride system semiconductor self-standing substrate comprises the steps of:

proving a hetero-substrate with a surface off-oriented in a specific direction from a low index surface of the substrate;

growing an epitaxial layer of III-V group nitride system semiconductor single crystal on the hetero-substrate; and separating the epitaxial layer from the hetero-substrate to have the III-V group nitride system semiconductor self-standing substrate with a predetermined off-orientation.

It is desirable that the hetero-substrate is a sapphire substrate that has a surface inclined in a specific direction from C-face of the substrate. The specific direction is the m-axis or a-axis direction of sapphire.

It is desirable that the hetero-substrate is a sapphire substrate that has a surface inclined 0.07 degrees or more and 20 degrees or less, more desirably 0.2 degrees or more and 16 degrees or less, in the a-axis or m-axis direction from C-face of the substrate.

According to fourth aspect of the invention, a III-V group nitride system semiconductor wafer comprises:

a self-standing substrate that has a hexagonal crystal system crystalline structure and is provided with a surface that is off-oriented in the a-axis or m-axis direction from C-face of the substrate; and a III-V group nitride system semiconductor layer that is homo-epitaxially grown on the self-standing substrate.

It is advantageous that the III-V group nitride system semiconductor self-standing substrate of the invention can offer an epitaxial growth layer with high flatness, uniformity and reproducibility when epitaxially growing a nitride system semiconductor layer on the self-standing substrate.

Further, it is advantageous that the method of making a III-V group nitride system semiconductor self-standing substrate of the invention can offer a III-V group nitride system semiconductor substrate with a suitable off-orientation with a good reproducibility while combining simple processes each not different from a known substrate manufacturing process.

Further, it is advantageous that the III-V group nitride system semiconductor wafer of the invention can provide, on the self-standing substrate, an epitaxial growth layer with high flatness, uniformity and reproducibility. Therefore, the production yield in both epitaxial growth process and device fabrication process can be enhanced. In addition, a light-emitting device or electronic device can be produced with characteristics as designed.

BRIEF DESCRIPTION OF THE DRAWINGS

The preferred embodiments according to the invention will be explained below referring to the drawings, wherein:

FIG. 3A shows the substrate with an off-angle inclined in the range of 0.09 to 24 degrees in the a-axis direction from C-face, FIG. 3B shows the substrate with an off-angle inclined in the range of 0.09 to 24 degrees in the m-axis direction from C-face;

DETAILED DESCRIPTION OF THE PREFERRED EMBODIMENTS

<1> Relationship Between an Underlying Substrate and an Epitaxial Layer Grown thereon At first, the inventor conducts an experiment that a III-V group nitride system semiconductor crystal is grown thick on various underlying substrates by HVPE, and then it is separated from the underlying substrate to obtain a self-standing substrate of III-V group nitride system semiconductor, so as to measure the off-direction and off-angle of the underlying substrate and grown crystal. As a result, it is found that: (i) the crystal axis of separated grown crystal is always inclined to a direction affected by the off-direction of underlying substrate in epitaxial growth; (ii) the off-angle of grown crystal does not always coincide with that of underlying substrate, and it is 0.8 to 1.5 times that of underlying substrate depending on the material of underlying substrate or the crystal growth conditions; and (iii) the off-direction and off-angle of grown crystal are given with a good reproducibility under the same growth conditions. For example, when GaN is epitaxially grown on a (0001)-face sapphire substrate, the surface of grown crystal also has (0001)-face and the orientation relationship is generated such that GaN a-axis <11-20> direction is aligned to sapphire substrate m-axis <1-100> direction.

Figure 1:
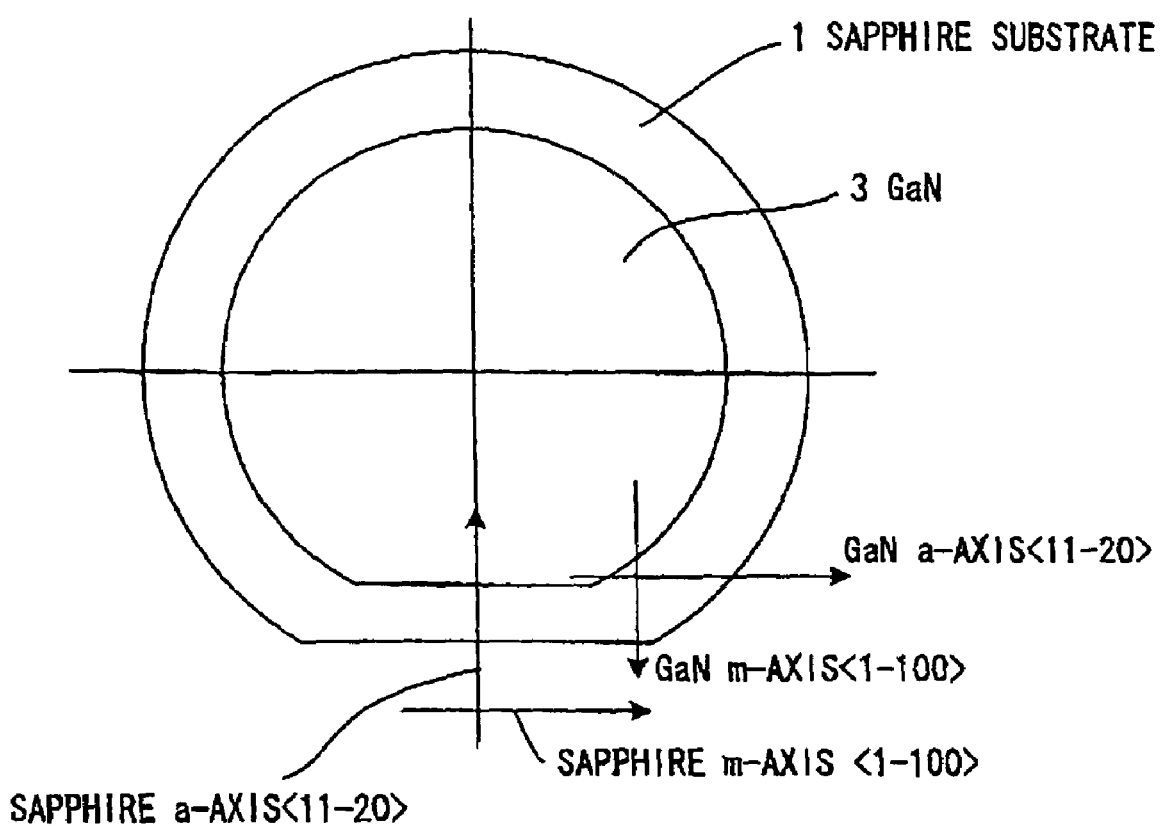
FIG. 1 shows a relationship in crystal orientation between sapphire substrate 1 with C-face and GaN epitaxial layer 3 grown on the sapphire substrate 1.

FIG. 1 shows a relationship in crystal orientation between sapphire substrate 1 with C-face and GaN epitaxial layer 3 grown on the sapphire substrate 1.

When a sapphire substrate as off-substrate is used, the crystal axis of GaN layer grown thereon is inclined to the same direction as the off-direction of sapphire substrate. If the sapphire substrate is off-oriented in the m-axis direction, then a GaN substrate with an off-orientation in the a-axis direction can be produced. On the contrary, if the sapphire substrate is off-oriented in the a-axis direction, then a GaN substrate with off-oriented in the m-axis direction can be produced.

The off-angle amount of grown GaN layer does not always coincide with that of underlying sapphire substrate, and it varies about 0.8 to 1.5 times depending on the growth conditions. Although the off-angle of GaN self-standing substrate after the separation further varies due to a bowing to be generated in the substrate and in-plane dispersion thereof may be thereby generated, the amount of bowing is not so large as compared to the off-angle amount of substrate in view of practical substrate manufacture. Therefore, if the off-direction and off-angle of underlying substrate are properly chosen according to the crystal growth conditions, a GaN self-standing substrate with desired off-direction and off-angle can be produced with a good reproducibility.

<2> Off-Angle of Self-Standing Substrate

Next, the inventor evaluates the crystalline quality of GaN self-standing substrate that is manufactured by growing thick GaN crystal on commercially-available single-crystal sapphire substrate with different off-angles by HVPE, then separating the GaN self-standing substrate from the sapphire substrate. As a result, as clearly exemplified in Example 1 described later, if the off-angle of sapphire substrate exceeds 20 degrees, then the generation of crystal nuclei with an orientation not aligned is observed at part of grown crystal. This means that the single-crystal property of self-standing substrate is damaged. Thus, in order to grow GaN single crystal with a good crystalline quality on the sapphire substrate, the off-angle of sapphire substrate is to be 20 degrees or less. The off-angle of GaN self-standing substrate obtained by using a 20 degrees off-oriented sapphire substrate is 24 degrees at the maximum, though it depends on the growth conditions. Thus, in order to have a GaN self-standing substrate with a good crystalline quality, the off-angle is desirably 24 degrees or less.

Further, the inventor evaluates the surface morphology of grown layers obtained such that a number of GaN substrates with different off-angles are prepared and then GaN is homo-epitaxially grown thereon by MOVPE. As a result, as clearly exemplified in Example 2 described later, if the off-angle of GaN substrate is less than 0.09 degrees, then a number of hexagonal microscopic uneven patterns with a size of 50 to 200 μm are observed on the epitaxial growth surface when observing the surface by a microscope. Thus, it is desirable that the GaN self-standing substrate has an off-angle of 0.09 degrees or more. The symptom of microscopic uneven pattern generation begins when the off-angle of GaN substrate is less than 0.2 degrees. Therefore, it is more desirable that the GaN self-standing substrate has an off-angle of 0.2 degrees or more.

The in-plane dispersion of off-angle of GaN self-standing substrate is desirably within ±1 degree, and it is desirable that the minimum off-angle is 0.09 degrees or more and the maximum off-angle is 24 degrees or less. This is because, if the in-plane dispersion of off-angle is not within ±1 degree, the quality of epi-layer grown thereon lowers, especially in case of mixed crystal grown thereon, the composition is highly disordered in in-plane uniformity and film thickness uniformity. Thereby, the yield of device will highly lower. The reasons of limiting the maximum and minimum values of off-angle of GaN self-standing substrate are as described earlier.

<3> Off-Angle of Underlying Substrate

From the research results by the inventor, a sapphire substrate with an off-angle of 0.07 degrees or more needs to be used so as to make a GaN self-standing substrate with an off-angle of 0.09 degrees or more. On the other hand, if the off-angle of sapphire substrate becomes too large, it becomes difficult to grow thick GaN single crystal thereon. Therefore, it is needed that the off-angle of sapphire substrate is 20 degrees or less so as to have a single-crystal GaN self-standing substrate with a good crystalline quality. Thus, in case of using a sapphire substrate as the underlying substrate, it is desirable that the underlying substrate desirably has a surface inclined in the range of 0.07 degrees to 20 degrees from the sapphire C-face.

Meanwhile, the inclination of crystal axis in the plane of substrate can be determined using a value obtained by the X-ray diffraction measurement.

<4> Method of Making a Self-Standing Substrate

Figure 2:
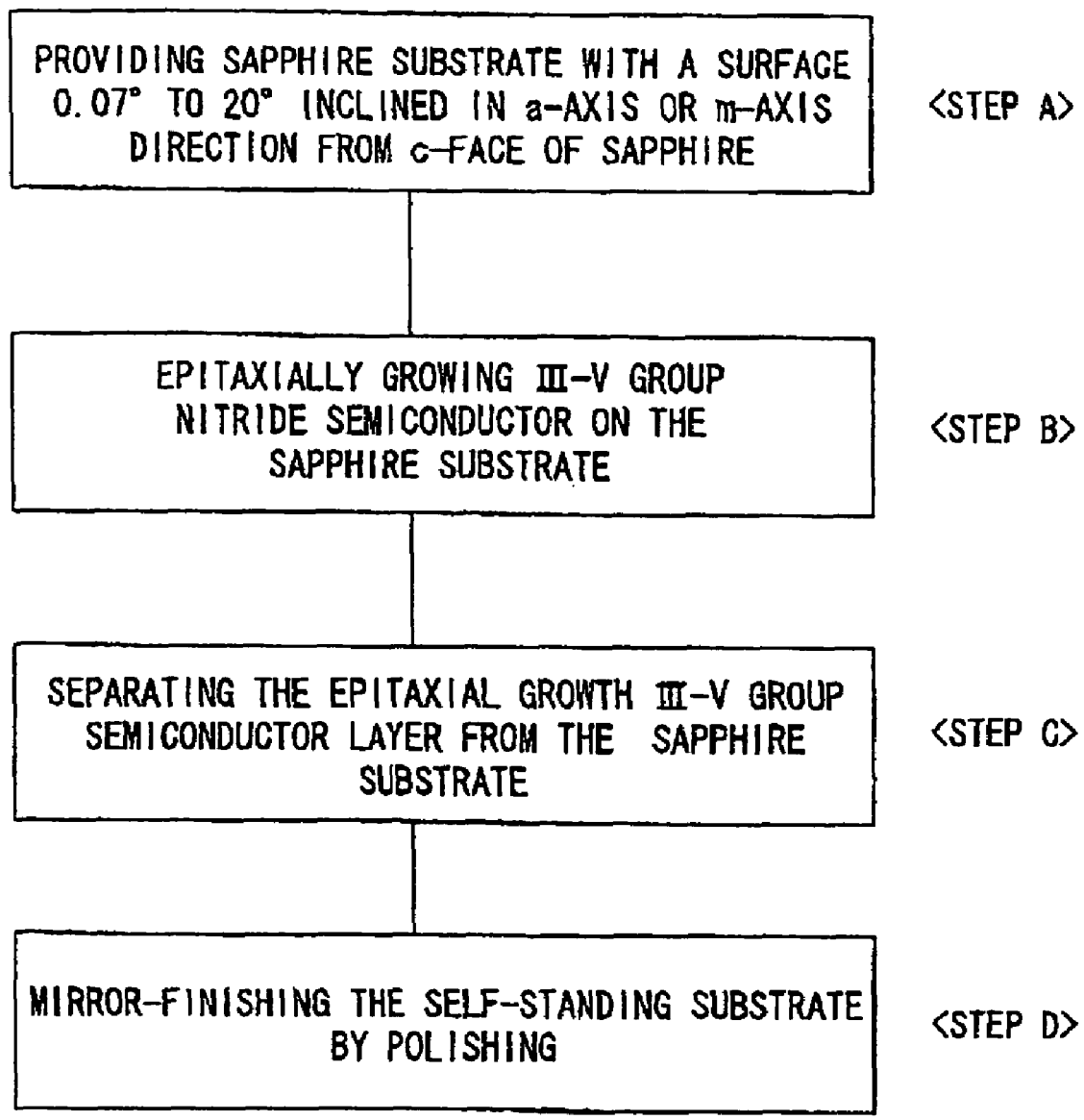
FIG. 2 is a flow chart showing a process of making a III-V group nitride system semiconductor self-standing substrate in a preferred embodiment according to the invention.

Referring to FIG. 2, a method of making a self-standing substrate of III-V group nitride system semiconductor by using a hetero-substrate will be explained below.

At first, a sapphire substrate as the hetero-substrate is provided that has a surface 0.07 to 20 degrees inclined in the a-axis or m-axis direction from the sapphire C-face (Step A).

Then, III-V group nitride system semiconductor is epitaxially grown on the sapphire substrate (Step B). The III-V group nitride system semiconductors available are represented by $In_xGa_yAl_{1-x-y}N$ ($0 \leq x \leq 1$, $0 \leq y \leq 1$, $0 \leq x+y \leq 1$). Of these, GaN and AlGaN are preferably used. This is because they satisfy properties required to a substrate material such as strength and stability in manufacture.

In making a self-standing substrate by separating the epitaxial growth layer from the hetero-substrate after the crystal growth, it is preferable to use the HVPE method with a high crystal growth rate.

Then, the III-V group nitride system semiconductor epitaxial growth layer thus grown is separated from the sapphire substrate (Step C). The separation of sapphire substrate may be conducted by VAS or etching.

Thus, the self-standing III-V group nitride system semiconductor substrate (GaN self-standing substrate) can be obtained. As described earlier, in the case that a sapphire substrate with a surface 0.07 to 20 degrees inclined in the a-axis direction from the sapphire C-face is used as the hetero-substrate, the GaN self-standing substrate with an off-angle inclined in the range of 0.07 to 20 degrees in the m-axis direction from the sapphire C-face can be obtained. On the other hand, in the case that a sapphire substrate with a surface 0.07 to 20 degrees inclined in the m-axis direction from the sapphire C-face is used as the hetero-substrate, the GaN self-standing substrate with an off-angle inclined in the range of 0.07 to 20 degrees in the a-axis direction from the sapphire C-face can be obtained.

Figure 3A:
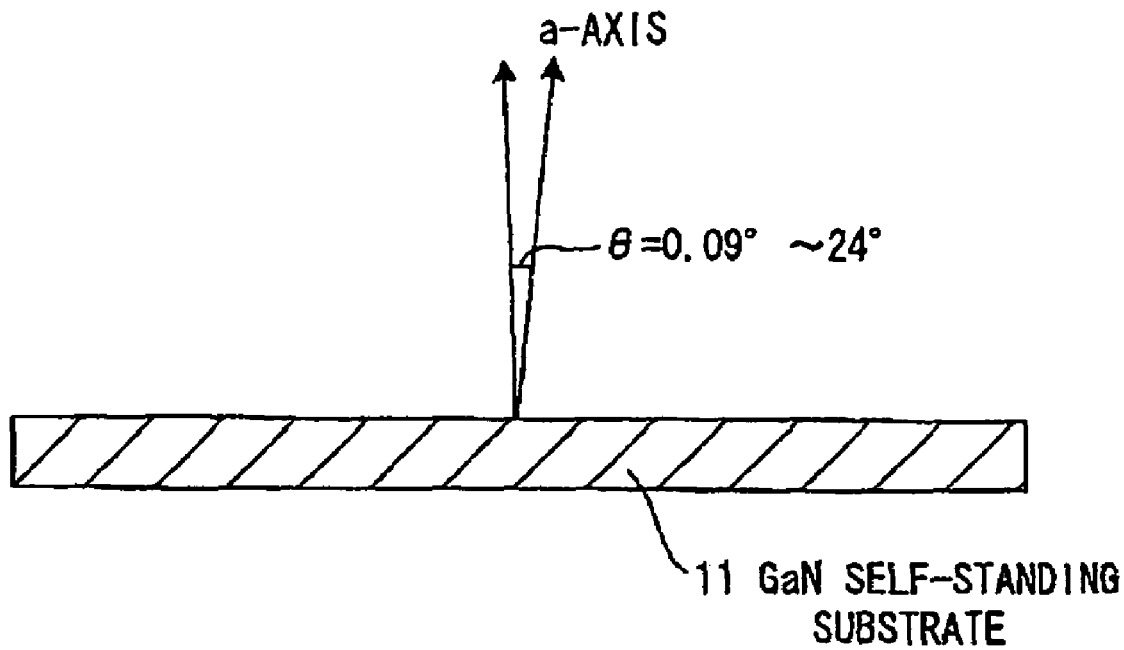
FIGS. 3A and 3B are cross sectional views showing the GaN self-standing substrate in the preferred embodiment of the invention, where
Figure 3B:
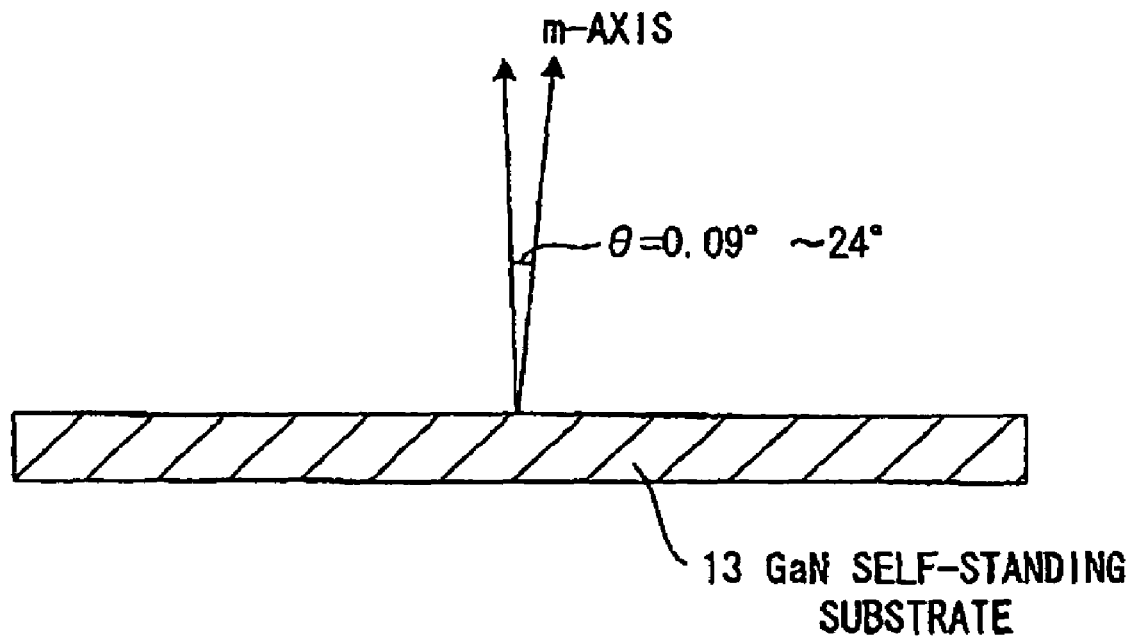

FIGS. 3A and 3B show examples of obtained self-standing substrates. FIG. 3A shows a substrate 11 with an off-angle inclined in the range of 0.09 to 24 degrees in the a-axis direction from C-face, and FIG. 3B shows a substrate 13 with an off-angle inclined in the range of 0.09 to 24 degrees in the m-axis direction from C-face.

Herein, a self-standing substrate means a substrate that can hold its shape by itself and has a sufficient strength for handling. In order to provide such a strength, the thickness of self-standing substrate needs to be preferably 200 µm or more. Also, in view of easiness in cleavage after the device fabrication, the thickness of self-standing substrate is preferably 1 mm or less. If it is greater than 1 mm, it becomes difficult to cleave the substrate and the cleavage surface is subjected to unevenness. As a result, if it is applied to a semiconductor laser etc., the device characteristics will deteriorate due to the reflection loss.

On the other hand, if the substrate has a bowing, the back face of substrate may not be in contact with a susceptor when the epitaxial growth of device structure is conducted on the substrate. In such a case, heat conduction to the substrate will be not uniform and, thereby, a temperature distribution will be generated in the plane of substrate. Due to the in-plane temperature distribution, during the epitaxial growth, dispersion in grown film thickness, composition, impurity concentration etc. will occur. Thus, since it is impossible to offer the in-plane uniform growth, dispersion in device characteristics will be thereby increased. Due to the above reasons, the bowing of substrate is to be suppressed as much as possible.

EXAMPLE 1

Manufacture of GaN Self-Standing Substrate

A GaN self-standing substrate is manufactured by a process as shown in FIG. 4. At first, single-crystal sapphire C-face substrates 21 with a diameter of 2 inches are provided that are each off-oriented 0.1, 0.5, 1, 3, 8, 15, 20 and 21 degrees in the m-axis direction (FIG. 4A).

Figure 4A:
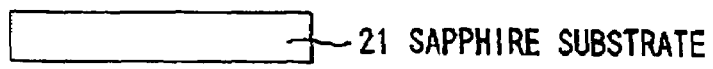
FIGS. 4A to 4G are schematic cross sectional views showing a process of making a GaN self-standing substrate in Example 1.
Figure 4B:
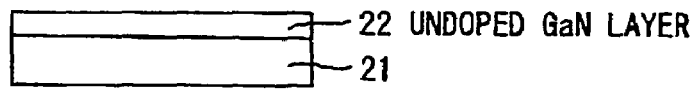
Figure 4C:
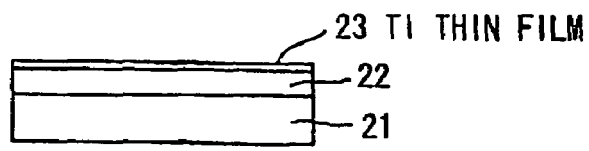
Figure 4D:
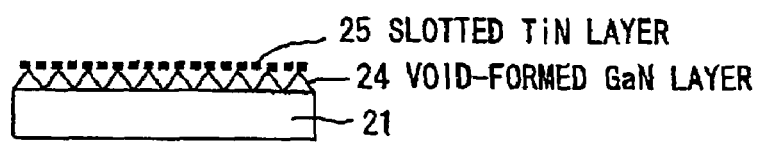

Then, a 300 nm undoped GaN layer 22 is grown on the sapphire substrate 21 by MOVPE using TMG, $NH_3$ as raw materials (FIG. 4B). Then, 20 nm Ti film 23 is deposited on the GaN epi-substrate (FIG. 4C), entered into an electric oven, and heated at 1050° C. for 20 min in $H_2$ flow with 20% $NH_3$ mixed therein. Thereby, Ti film 23 is processed into a mesh-like slotted TiN layer 25 and simultaneously the GaN layer 22 is processed into a void-formed GaN layer 24 (FIG. 4D).

Figure 4E:
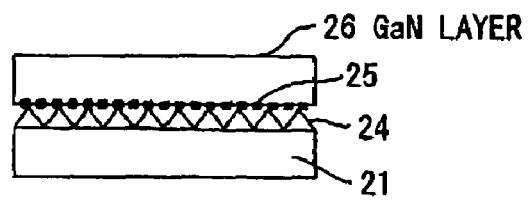
Figure 4F:
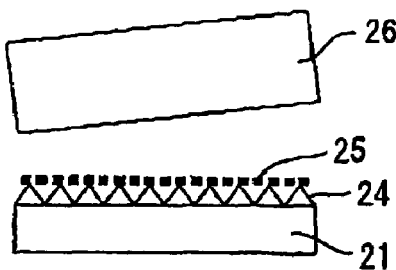
Figure 4G:
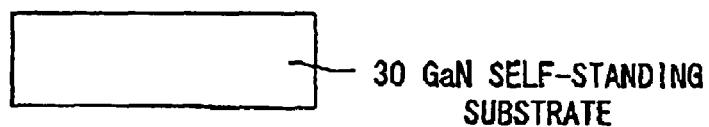

This is entered in an HVPE furnace, and then a 500 µm GaN layer 26 is deposited (FIG. 4E). $NH_3$ and GaCl are used raw materials and $N_2$ is used as carrier gas. The growth conditions are atmospheric pressure and the substrate temperature is 1040° C. The HVPE crystal growth is repeated while changing the growth rate among 60, 100, 120, 150 and 180 µm/h by changing the amount of GaCl supplied. In the cooling process after the completion of growth, the GaN layer 26 is separated at the void-formed GaN layer 24 from the sapphire substrate (FIG. 4F). Thus, a GaN self-standing substrate 30 is obtained (FIG. 4G).

The inclination of crystal axis of GaN substrate thus obtained is measured by the X-ray diffraction measurement, and a correlation with the underlying sapphire substrate. The crystal axes of GaN substrates are all off-oriented in the a-axis direction due to the off-orientation of underlying sapphire substrate. In all growth conditions, the off-angle of GaN substrate has a good linear correlation with the off-angle of underlying sapphire substrate. However, in case of a sapphire substrate with 21 degrees off-orientation, good single crystal GaN cannot be obtained in any growth conditions.

Figure 5:
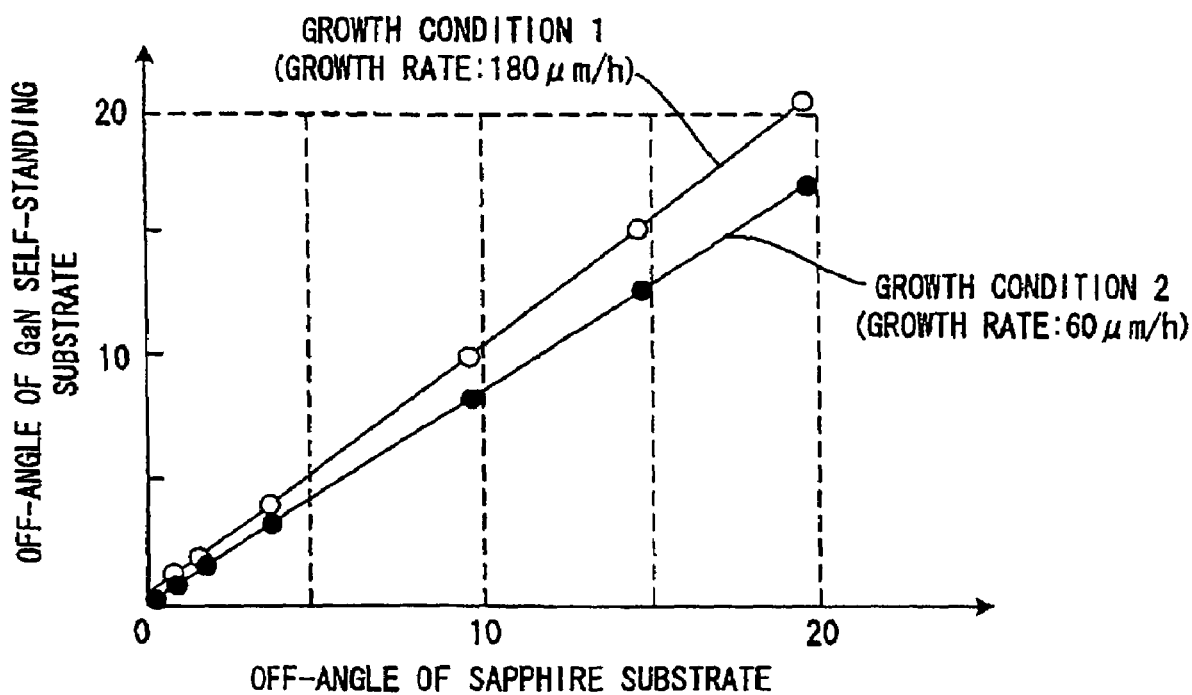
FIG. 5 is a graph showing a relationship between the amount of off-angle of sapphire underlying substrate and the amount of off-angle of GaN self-standing substrate.

FIG. 5 is a graph showing a relationship between the amount of off-angle of sapphire underlying substrate and the amount of off-angle of GaN self-standing substrate. In FIG. 5, growth conditions 1 and 2 correspond to data that the off-angle of GaN substrate is most significantly fluctuated to the off-angle of underlying sapphire substrate on the positive side or negative side. The growth rate of condition 1 is 180 µg m/h and the growth rate of condition 2 is 60 µm/h.

From the results shown in FIG. 5, it is confirmed that, by fine controlling the off-angle of underlying sapphire substrate to be 20 degrees or less, a good GaN substrate with a desired off-angle can be obtained.

EXAMPLE 2

Formation of GaN Layer on the GaN Self-Standing Substrate

Figure 6:
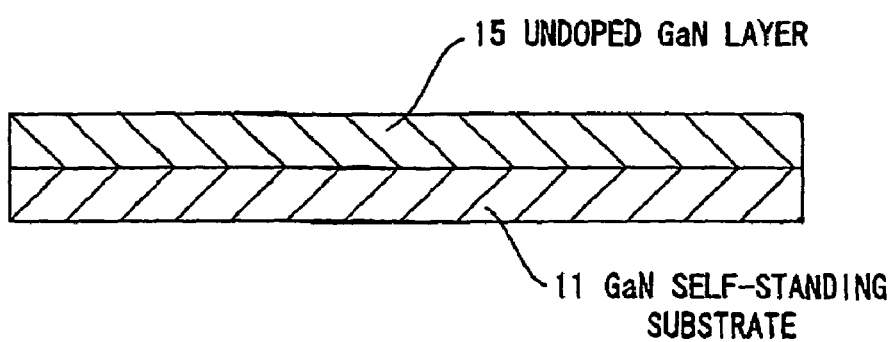
FIG. 6 is a cross sectional view showing the GaN self-standing substrate in Example 1 with a GaN layer grown thereon (Example 2).

The GaN self-standing substrates with different off-angles manufactured in Example 1 are mirror-finished by polishing on both surfaces. Then, as shown in FIG. 6, a 4 µm undoped layer 15 is grown on the GaN self-standing substrate 11 by MOVPE using TMG (trimethylgallium) and $NH_3$ as raw materials. In the MOVPE growth, the growth pressure is atmospheric and the substrate temperature is 1050° C. The carrier gas is mixed gas of hydrogen and nitrogen. The crystal growth rate is about 4 µm/h.

The surface of epitaxial undoped GaN layer 15 thus obtained appears to be a mirror surface to the naked eye. However, when observing the surface by the Nomarski microscope, a number of microscopic hexagonal hillocks with a diameter of about 50 to 200 µm are generated on the surface of an epitaxial layer grown on substrates with an off-angle of less than 0.09 degrees. In contrast, on the surface of an epitaxial layer grown on substrates with an off-angle of 0.09 degrees or more, a linear morphology assumed to be formed due to the step bunching is observed. Accordingly, it is desirable that the GaN self-standing substrate 11 has an off-angle of 0.09 degrees or more.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, although in the above embodiments the sapphire substrate is used as the underlying substrate to fabricate the III-V group nitride system semiconductor substrate of the invention, all conventionally known substrates, such as GaAs, Si, $ZrB_2$ and ZnO, to be used as a GaN system epitaxial layer forming substrate can be applied thereto.

In the invention, it is desirable that the self-standing substrate is provided with a hexagonal system C-face, especially III-group face, on the surface because the III-group face is chemically, mechanically and thermally stable. However, it may be of cubic system crystal and may be provided with A-face or R-face other than C-face on the surface.

What is claimed is:
1. A method of making a III-V group nitride system semiconductor self-standing substrate for a semiconductor laser, comprising:
  providing a hetero-substrate that comprises a sapphire substrate that has a surface off-oriented by 0.07 degrees or more and 20 degrees or less in an m-axis direction from a C-face of the sapphire substrate;

growing an epitaxial layer of III-V group nitride system semiconductor single crystal on the hetero-substrate; and separating the epitaxial layer from the hetero-substrate to have the III-V group nitride system semiconductor self-standing substrate with a predetermined off-orientation in an a-axis direction.

2. A method of making a III-V group nitride system semiconductor self-standing substrate for a semiconductor laser, comprising:

providing a hetero-substrate that comprises a sapphire substrate that has a surface off-oriented by 0.07 degrees or more and 20 degrees or less in an a-axis direction from C-face of the substrate;

growing an epitaxial layer of III-V group nitride system semiconductor single crystal on the hetero-substrate; and separating the epitaxial layer from the hetero-substrate to have the III-V group nitride system semiconductor self-standing substrate with a predetermined off-orientation in an m-axis direction.

3. The method according to claim 1, wherein the predetermined off-orientation of the III-V group nitride system semiconductor self-standing substrate is 0.09 degrees or more and 24.0 degrees or less.

4. The method according to claim 2, wherein the predetermined off-orientation of the III-V group nitride system semiconductor self-standing substrate is 0.09 degrees or more and 24.0 degrees or less.

5. The method according to claim 1, wherein an off-angle amount of the III-V group nitride system semiconductor self-standing substrate varies about 0.8 to 1.5 times that of the hetero substrate based on a linear relation.

6. The method according to claim 2, wherein an off-angle amount of the III-V group nitride system semiconductor self-standing substrate varies about 0.8 to 1.5 times that of the hetero substrate based on a linear relation.

7. The method according to claim 1, wherein the hetero-substrate has a surface off-oriented by 1 degree or more and 20 degrees or less.

8. The method according to claim 2, wherein the hetero-substrate has a surface off-oriented by 1 degree or more and 20 degrees or less.

9. The method according to claim 1, wherein the III-V group nitride system semiconductor self-standing substrate comprises $In_xGa_yAl_{1-x-y}N$, wherein $0 \leq x \leq 1$, $0 \leq y \leq 1$, and $0 \leq x+y \leq 1$.

10. A method of making a III-V group nitride system semiconductor wafer comprising:

providing a hetero-substrate that comprises a sapphire substrate that has a surface off-oriented by 0.07 degrees or more and 20 degrees or less in one of an m-axis direction and an a-axis direction from a C-face of the sapphire substrate;

growing an epitaxial layer of III-V group nitride system semiconductor single crystal on the hetero-substrate;

separating the epitaxial layer from the hetero-substrate to have a III-V group nitride system semiconductor self-standing substrate, the substrate having a hexagonal crystal system crystalline structure and provided with a predetermined off-orientation in one of the m-axis direction and the a-axis direction from a C-face of the self-standing substrate; and growing a III-V group nitride system semiconductor layer that is homo-epitaxially grown on the self-standing substrate.

11. The method according to claim 1, wherein an in-plane dispersion of said predetermined off-orientation of said self-standing substrate is within ±1 degree.

12. The method according to claim 2, wherein an in-plane dispersion of said predetermined off-orientation of said self-standing substrate is within ±1 degree.

13. The method according to claim 2, wherein the III-V group nitride system semiconductor self-standing substrate comprises $In_xGa_yAl_{1-x-y}N$, wherein $0 \leq x \leq 1, 0 \leq y \leq 1$, and $0 \leq x+y \leq 1$.

14. The method according to claim 1, wherein the III-V group nitride system semiconductor self-standing substrate has a thickness in a range from 200 μm to 1 mm.

15. The method according to claim 2, wherein the III-V group nitride system semiconductor self-standing substrate has a thickness in a range from 200 μm to 1 mm.

* * * * *